US012587140B2

(12) United States Patent　　　　(10) Patent No.: US 12,587,140 B2
　Khlat　　　　　　　　　　　　　　　　(45) Date of Patent: Mar. 24, 2026

(54) BARELY DOHERTY ET USING ET VCC MODULATION FOR BIAS CONTROL

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 663 days.

(21) Appl. No.: 17/872,140

(22) Filed: Jul. 25, 2022

(65) Prior Publication Data

US 2023/0246596 A1　　Aug. 3, 2023

Related U.S. Application Data

(60) Provisional application No. 63/305,471, filed on Feb. 1, 2022.

(51) Int. Cl.
　H03F 3/195　　　(2006.01)
　H03F 1/02　　　(2006.01)
　H03F 3/24　　　(2006.01)

(52) U.S. Cl.
　CPC ......... H03F 1/0288 (2013.01); H03F 1/0227 (2013.01); H03F 3/195 (2013.01);
　　　　　(Continued)

(58) Field of Classification Search
　CPC .... H03F 1/0288; H03F 1/0277; H03F 1/0261; H03F 1/0216; H03F 3/195; H03F 3/245; H03F 3/19; H03F 2200/102
　　　　　(Continued)

(56) References Cited

U.S. PATENT DOCUMENTS

2002/0146993 A1* 10/2002 Persico ................. H03F 1/0261
　　　　　　　　　　　　　　　　　455/127.5
2004/0119533 A1　　6/2004 Kwon et al.
　　　　　　　　　　(Continued)

FOREIGN PATENT DOCUMENTS

JP　　2014175760 A　　9/2014
KR　　20150000966 A　　1/2015

OTHER PUBLICATIONS

Author Unknown, "Doherty amplifier with cooperative power tracking and bias adaption for high efficiency," Research Disclosure, May 2012, 27 pages.

(Continued)

*Primary Examiner* — Andrea Lindgren Baltzell
*Assistant Examiner* — Nareh Shamiryan
(74) *Attorney, Agent, or Firm* — Withrow & Terranova, P.L.L.C.

(57)　　　　　ABSTRACT

A power amplifier system is disclosed with a carrier amplifier having a carrier bias input and a carrier supply node and a peaking amplifier having a peaking bias input and a peaking supply node. Also included is an envelope tracking power supply having a modulated voltage supply output coupled to the peaking supply node. Further included is a peaking bias controller having a peaking bias control input coupled to the peaking supply node and a peaking bias control output coupled to the peaking bias input, wherein the peaking bias controller is configured to generate in response to a modulated peaking supply voltage generated by the envelope tracking power supply at the peaking supply node a modulated peaking bias signal that controls bias of the peaking amplifier.

21 Claims, 16 Drawing Sheets

(52) U.S. Cl.
CPC ....... *H03F 3/245* (2013.01); *H03F 2200/102* (2013.01); *H03F 2200/451* (2013.01)

(58) Field of Classification Search
USPC .............................................. 330/124 R, 295
See application file for complete search history.

(56) References Cited

U.S. PATENT DOCUMENTS

| | | |
|---|---|---|
| 2010/0148862 A1 | 6/2010 | Woo |
| 2015/0116039 A1 | 4/2015 | Ahmed et al. |
| 2015/0180428 A1 | 6/2015 | Pham et al. |
| 2015/0263678 A1 | 9/2015 | Kunihiro |
| 2015/0295541 A1 | 10/2015 | Hur et al. |
| 2015/0318827 A1 | 11/2015 | Srinidhi Embar et al. |
| 2017/0163220 A1 | 6/2017 | Yamamoto et al. |
| 2017/0257068 A1 | 9/2017 | Hur et al. |
| 2018/0241362 A1 | 8/2018 | Takenaka |
| 2020/0350866 A1 | 11/2020 | Pehlke |
| 2021/0167735 A1 | 6/2021 | Baroudi et al. |
| 2021/0384867 A1* | 12/2021 | Imai ...................... H03F 1/0288 |
| 2021/0399688 A1 | 12/2021 | Koroglu et al. |
| 2022/0231638 A1 | 7/2022 | Hatanaka |
| 2022/0239259 A1 | 7/2022 | Sakata et al. |
| 2023/0046261 A1 | 2/2023 | Yu et al. |

OTHER PUBLICATIONS

Lee, Y.-S et al., "Highly Linear and Efficient Doherty Amplifier Employing Power Tracking Bias Supply Scheme for WCDMA Applications," 2008 IEEE Radio and Wireless Symposium, Jan. 22-24, 2008, Orlando, FL, USA, IEEE, pp. 73-76.

Ryu, N. et al., "CMOS Doherty Amplifier With Variable Balun Transformer and Adaptive Bias Control for Wireless LAN Application," IEEE Journal of Solid-State Circuits, vol. 49, No. 6, Jun. 2014, IEEE, pp. 1356-1365.

Extended European Search Report for European Patent Application No. 23154372.9, mailed Jun. 6, 2023, 14 pages.

Darraji, R. et al., "Mitigation of Bandwidth Limitation in Wireless Doherty Amplifiers With Substantial Bandwidth Enhancement Using Digital Techniques," IEEE Transactions on Microwave Theory and Techniques, vol. 60, No. 9, Sep. 2012, IEEE, pp. 2875-2885.

Kim, J.-H. et al., "Analysis and Implementation of Doherty Power Amplifier With Two-Point Envelope Modulation," IEEE Transactions on Microwave Theory and Techniques, vol. 60, No. 5, May 2012, IEEE, pp. 1353-1364.

Extended European Search Report for European Patent Application No. 23171932.9, mailed Oct. 10, 2023, 14 pages.

* cited by examiner

Vcc (APT)

Carrier Amplifier    14

RFFE — 52

34

22    24

RF
Input

Hybrid

DPAB — 48

32

Impedance
Inverter

36

Bias — 50

28

36

26

Peaking Amplifier

Vcc (ET)

ET 52    56

Vcccarrier (ET)
Carrier Amplifier    54

RFFE    Bias

34

22    24

RF
Input

Hybrid 60    62

Peaking
Bias
Controller — 58

32

Impedance
Inverter

36

Vccpeaking (ET)

28

36    64    66

26

Peaking Amplifier

BARELY DOHERTY ET USING ET VCC MODULATION FOR BIAS CONTROL

RELATED APPLICATIONS

This application claims the benefit of provisional patent application Ser. No. 63/305,471, filed Feb. 1, 2022, the disclosure of which is hereby incorporated herein by reference in its entirety.

FIELD OF THE DISCLOSURE

The present disclosure relates generally to radio frequency transmitters and, more particularly, to envelope tracking circuits that control Doherty-type power amplifiers within radio frequency transmitters.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as wireless fidelity (Wi-Fi), long-term evolution (LTE), and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices.

Various power amplifier arrangements have been proposed and implemented in transmitter chains within the mobile communication devices to provide the desired output power while also meeting the power level control requirements of 5G-NR. One such power amplifier arrangement is the Doherty amplifier, which uses a carrier amplifier to operate at voltages up to the average power and uses the carrier amplifier and a peaking amplifier to operate at voltages between the average power and a peak power. While the Doherty amplifier provides options for providing power amplification, there remains room for improved energy efficiency and linearity during power amplification.

SUMMARY

A power amplifier system is disclosed with a carrier amplifier having a carrier bias input and a carrier supply node and a peaking amplifier having a peaking bias input and a peaking supply node. Also included is an envelope tracking power supply having a modulated voltage supply output coupled to the peaking supply node. Further included is a peaking bias controller having a peaking bias control input coupled to the peaking supply node and a peaking bias control output coupled to the peaking bias input, wherein the peaking bias controller is configured to generate in response to a modulated peaking supply voltage generated by the envelope tracking power supply at the peaking supply node a modulated peaking bias signal that controls bias of the peaking amplifier.

In an exemplary embodiment, the power amplifier system further includes a carrier bias controller having a carrier bias control input coupled to the carrier supply node and a carrier bias control output coupled to the carrier bias input, wherein the carrier bias controller is configured to generate in response to a modulated carrier supply voltage generated by the envelope tracking power supply at the carrier supply node a modulated carrier bias signal that controls bias of the carrier amplifier.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
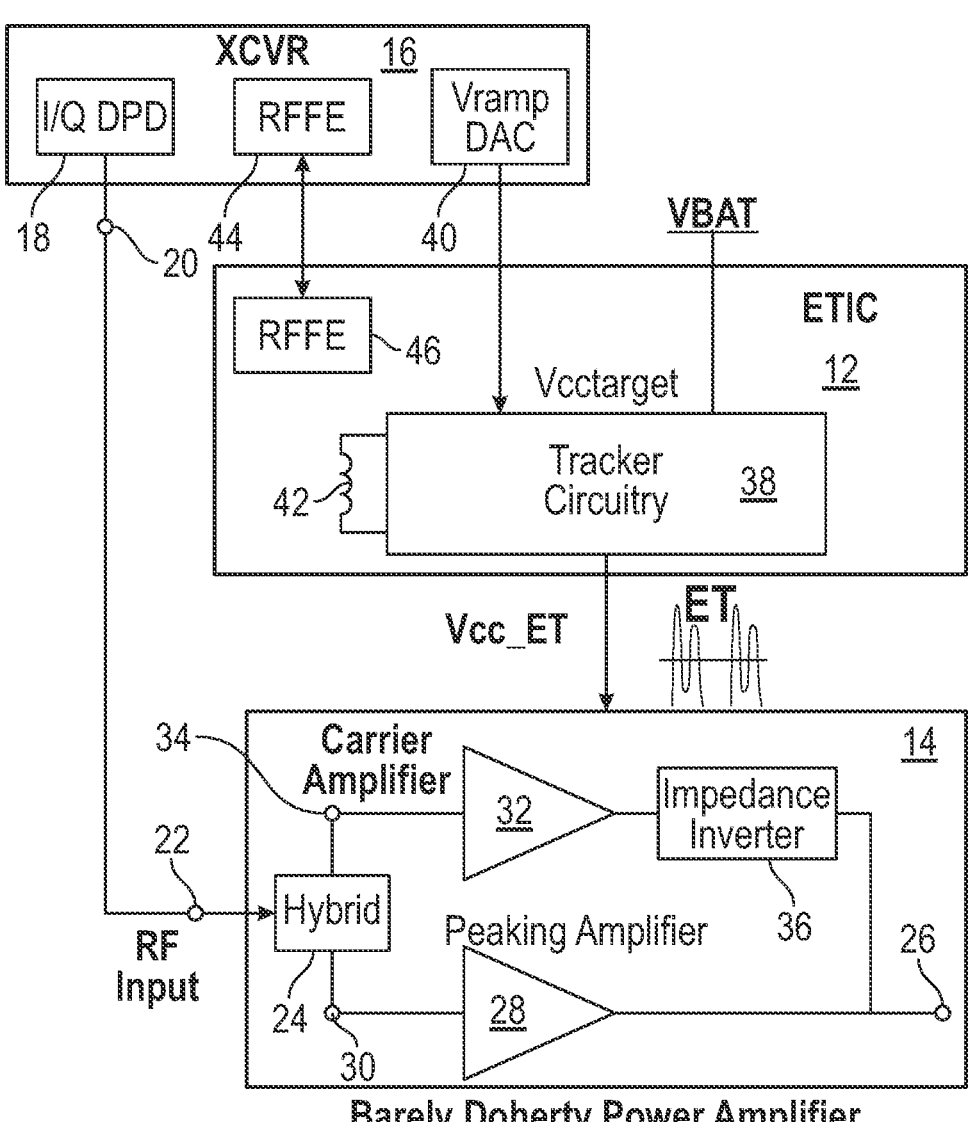
FIG. 1 is a block diagram of a related-art power amplifier system having an envelope tracking integrated circuit (ETIC) and a barely Doherty power amplifier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to a method to control the peaking amplifier of a load modulation power amplifier for a full or barely Doherty envelope tracking (ET) power amplifier.

FIG. 1 is a schematic depicting a related-art power amplifier system 10 having an envelope tracking integrated circuit (ETIC) 12, a Doherty ET power amplifier 14, and a transceiver (XCVR) 16. The ETIC 12 is configured to supply the barely Doherty ET power amplifier 14 with modulated power that tracks the envelope of a radio frequency (RF) signal generated by the XCVR 16. An in-phase/quadrature digital pre-distortion (I/Q DPD) 18 included in the XCVR 16 has a predistortion output 20 that is coupled to an RF input 22 of a hybrid coupler 24 included in the Doherty ET power amplifier 14. The RF signal generated by the XCVR 16 is pre-distorted by the I/Q DPD 18 to improve linearity of an amplified version of the RF signal output from an RF output 26. A peaking amplifier 28 is coupled between a first coupler output 30 and the RF output 26. A carrier amplifier 32 is coupled in series between a second coupler output 34 and an impedance inverter 36 coupled to the RF output 26.

Tracker circuitry 38 included in the ETIC 12 receives an analog signal Vcctarget that is generated by a Vramp digital-to-analog (DAC) converter 40. Vramp is a digital signal that follows the envelope of the RF signal being amplified by the Doherty ET power amplifier 14. The tracker circuitry 38 incorporates a power inductor 42 to filter an envelope tracked supply voltage VCC_ET. A first RF front-end (RFFE) interface 44 of the XCVR 16 is coupled to a second RFFE interface 46 of the ETIC 12. The XCRV 16 is configured to send digital control signals and data between the first RFFE interface 44 and the second RFFE interface 46 to control the ETIC 12. The digital control signals include but are not limited to switching RF bands and controlling power levels.

Figure 2:
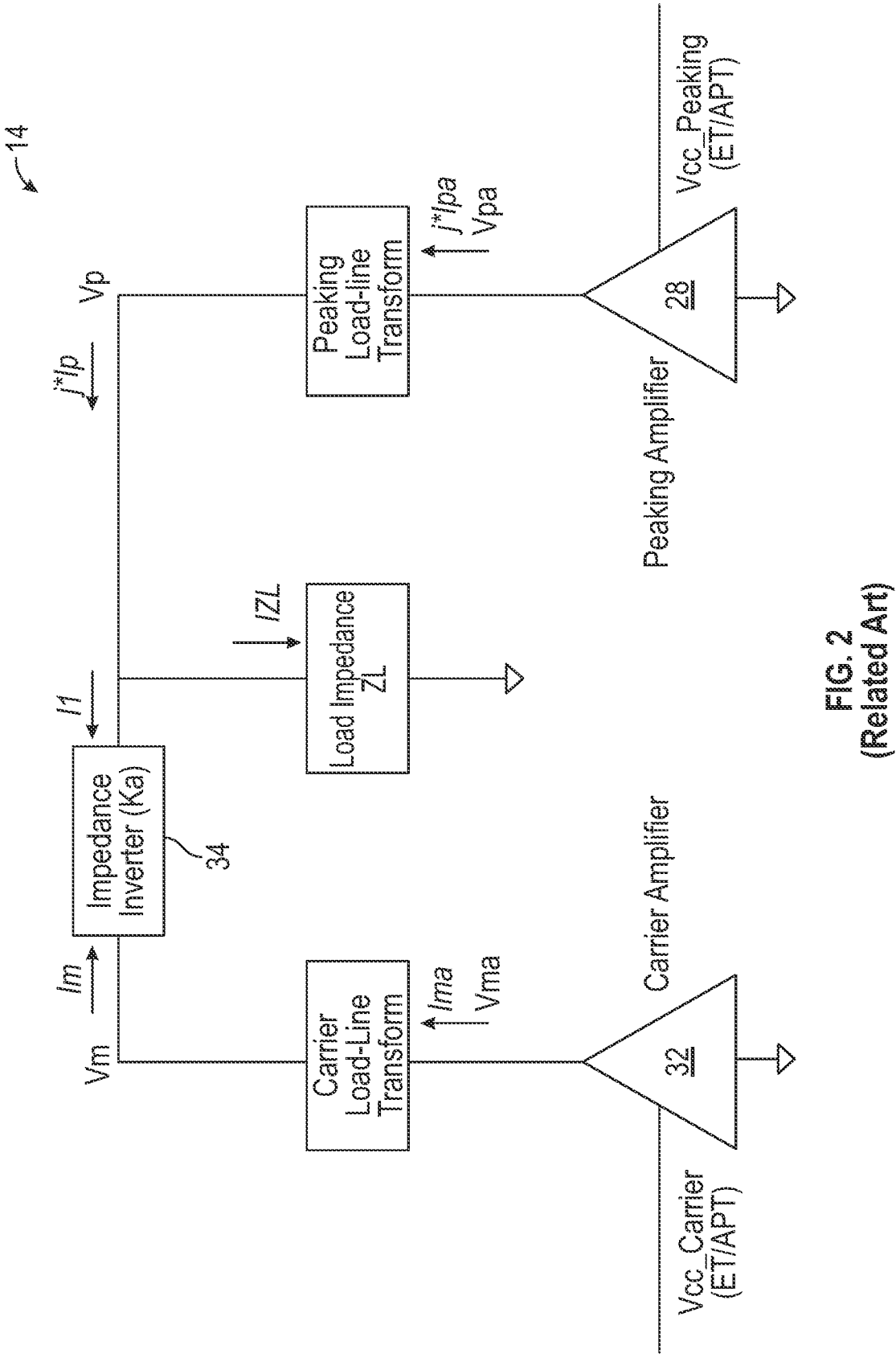
FIG. 2 is a block diagram showing a related-art basic barely Doherty power amplifier.

FIG. 2 shows a basic simplified schematic of the related-art Doherty ET power amplifier 14 and defined baseband parameters. This simple model of the radio frequency (RF) voltages and currents of the Doherty power amplifier, which is of the load-line modulation type, includes the peaking amplifier 28 and the carrier amplifier 32. The envelope of the RF voltage across the carrier amplifier 32 is designated Vm, and the associated baseband current is designated Im. The envelope of the RF voltage across the peaking amplifier is designated Vp, and the associated baseband current is designated j*Ip, wherein $j^2=-1$.

The impedance inverter 36 having an impedance inverter coefficient Ka is a block that makes $Zin*ZL=-Ka^2$, with $Ka=j*|Ka|$, with $|Ka|=2*ZL$ for the barely Doherty power amplifier 14, and Zin and ZL are the impedance at the RF input 22 and the RF output 26, respectively, of the impedance inverter 36. The impedance inverter coefficient Ka equals a value of characteristic impedance Z0 that provides impedance inversion between an input and an output of the impedance inverter 36.

Figures 3, 4:
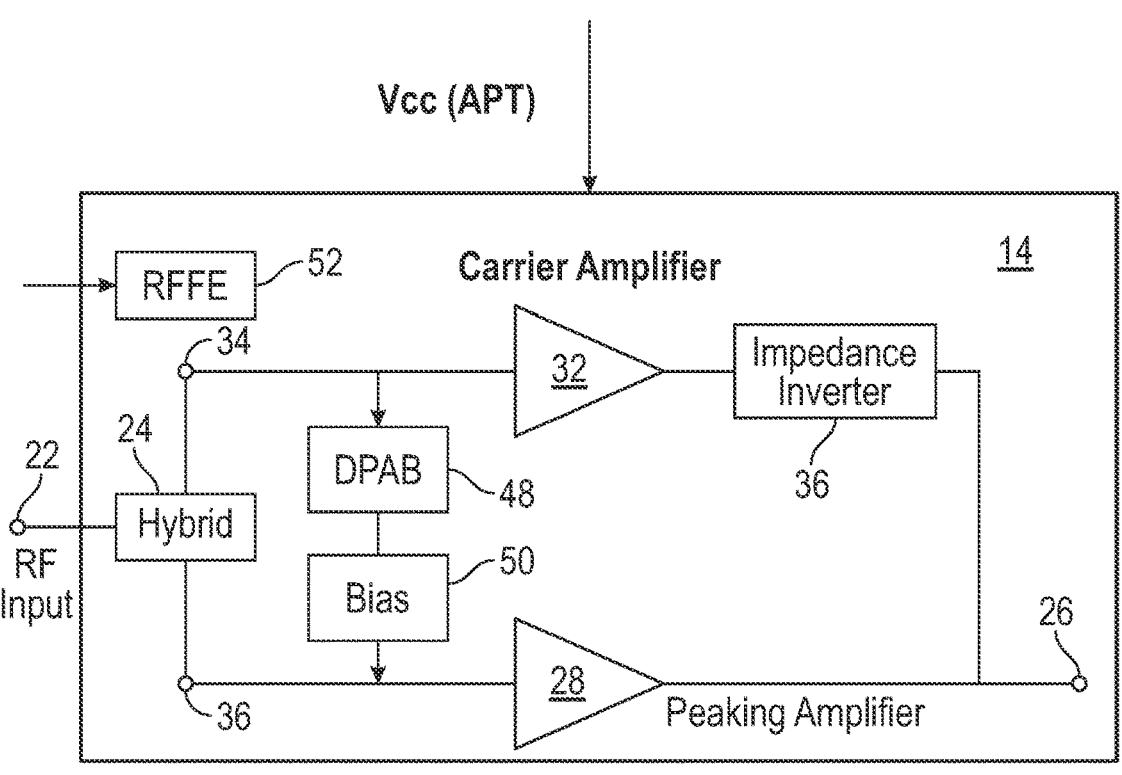
FIG. 3 is a diagram showing related art of a bias control of the peaking amplifier.
FIG. 4 is a diagram showing an embodiment in which the peaking amplifier bias (t)=f (Vcc peaking (t)) with the power supply voltage (Vcc) peaking in an ET modulated supply.

In a related-art diagram of a load modulation mainly in average power tracking (APT) mode, FIG. 3 shows the related-art Doherty ET power amplifier 14 with dynamic power amplifier bias (DPAB) control circuitry 48 that is configured to control bias circuitry 50 of the peaking amplifier 28. In operation, the DPAB control circuitry 48 activates the bias circuitry 50 to bias the peaking amplifier 28 from one class of operation to another class of operation during the modulation envelope ET. The DPAB control circuitry 48 that responds to the detected envelope of the modulation envelope ET at a base of the carrier amplifier 32 and couples detected envelope to the bias circuitry 50 of the peaking amplifier 28 and thereby increasing or decreasing the class of operation of the peaking amplifier. The DPAB control circuitry 48 is also known as a fast bias-debias controller.

In a barely ET Doherty power amplifier, in related art, the circuit DPAB is disabled, and both the peaking amplifier 28 and the carrier amplifier 32 are operating in class AB, and no bias changes are done on the peaking amplifier 28. A third RFFE interface 52 is included to allow changes to amplifier parameters such as power level control during operation of the related-art Doherty ET power amplifier 14.

A method according to the present disclosure uses the modulated power supply voltage (Vcc) signal that changes vs. the modulation envelope for isogain operation, for example, to control the bias of the peaking amplifier where the modulated ET Vcc signal is adjusting and changing the class of operation of the peaking amplifier, and thus allowing improved efficiency and reduced memory effects without the need to detect wide modulation envelope. Basically, the peaking amplifier modulated bias is a function of the ET supply modulation signal, that is, peaking amplifier bias (t)=f (Vcc (t)). This allows the peaking amplifier to operate in Class C at low power level and quickly bias/debias when load modulation is applied using the same modulation ET Vcc signal, such that both ET Vcc and the bias modulation move at the same rate and change at the same time.

FIG. 4 shows an exemplary embodiment of a barely Doherty ET power amplifier 54 in which the peaking amplifier bias (t)=f (Vcc peaking (t)) with the Vcc peaking in an ET modulated supply. In some embodiments, the modulation bandwidth of the ET modulated supply is between 400 MHz and 500 MHz. In this exemplary embodiment, the carrier amplifier 32 has traditional bias circuitry 56, while bias to the peaking amplifier 28 is controlled by a peaking bias controller 58. The peaking bias controller 58 has a peaking bias control input 60 coupled to a peaking supply node 62 and a peaking bias control output 64 coupled to a peaking bias input 66. In operation, the peaking bias controller 58 generates a modulated peaking bias signal that controls bias of the peaking amplifier 28 in response to a modulated peaking supply voltage at the peaking supply node 62.

Figures 5, 6:
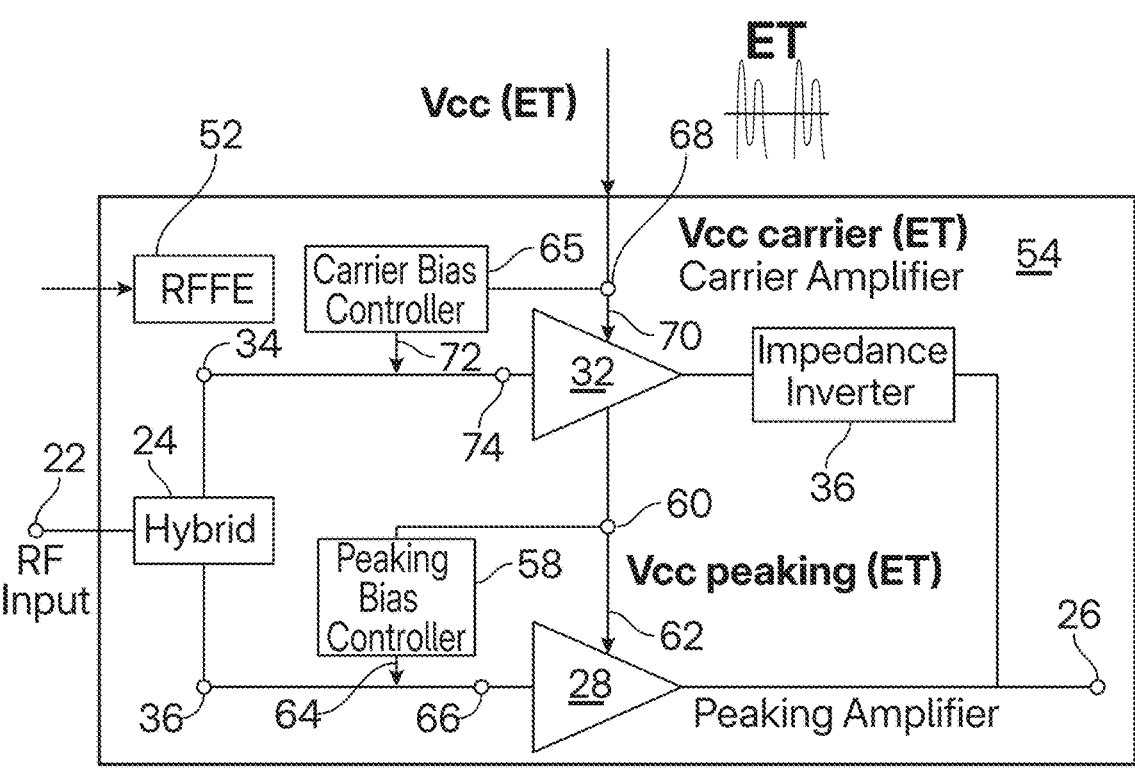
FIG. 5 is a diagram showing another embodiment in which each amplifier uses the ET modulated supply to modulate also the bias.
FIG. 6 is a diagram showing a bias network that maps ET Vcc into a bias modulation that is made programmable.

FIG. 5 is a schematic of another exemplary embodiment of the barely Doherty power amplifier 54. In this embodiment, the barely Doherty power amplifier 54 includes a carrier bias controller 65 having a carrier bias control input 68 coupled to a carrier supply node 70 and a carrier bias control output 72 coupled to a carrier bias input 74. In operation, the carrier bias controller 65 generates a modulated carrier bias signal that controls bias of the carrier amplifier 32 in response to a modulated carrier supply voltage at the carrier supply node 70. As a result of this exemplary embodiment, the respective bias of both the carrier amplifier 32 and the peaking amplifier 28 are modulated by the modulated ET Vcc supply voltage.

Figure 7:
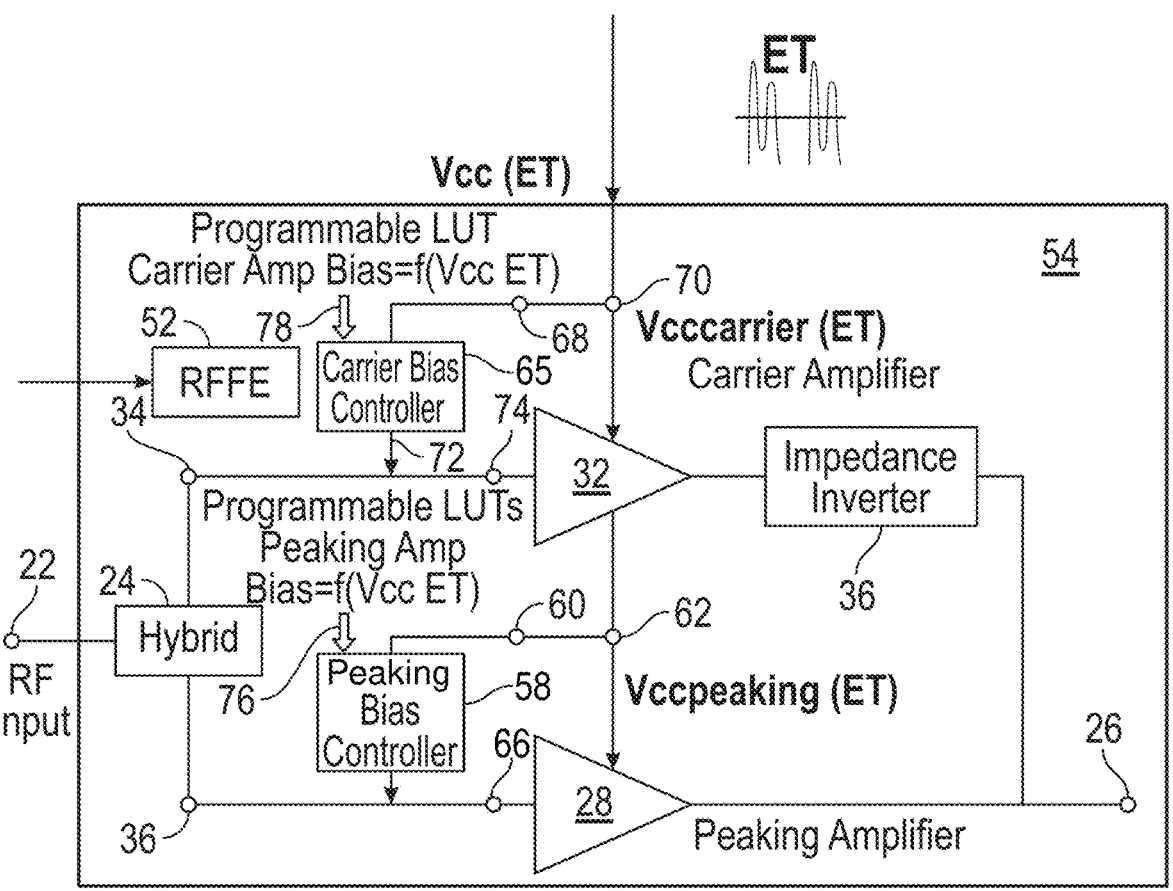
FIG. 7 is a diagram showing both carrier and peaking amplifiers bias mapping to ET Vcc that are made programmable.

The peaking bias controller 58 is made programmable to map a given ET Vcc voltage into a given bias response by way of a peaking look-up table that is a first programmable analog look-up table (LUT) 76, which as shown in FIG. 6 and indicated by the arrow may be included in the peaking bias controller 58. The peaking look-up table has direct current (DC) peaking bias values that correspond with instantaneous levels of the modulated peaking supply voltage. The DC peaking bias values in the peaking LUT may correspond nonlinearly to levels of the modulated peaking supply voltage. This allows for flexible and potentially nonlinear relationships between ET Vcc voltages and bias responses, optimizing performance characteristics such as efficiency and linearity. This exemplary embodiment can be extended to control biases of both the carrier amplifier 32 and the peaking amplifier 28 by adding a second programmable analog LUT 78, as shown in FIG. 7. The second programmable analog LUT may also be referred to as a carrier look-up table, which may be included in the carrier bias controller 65 as indicated by the arrow representing the carrier look-up table. The carrier LUT includes DC bias values that correspond with instantaneous levels of modulated carrier supply voltage. In some embodiments, the DC carrier bias values correspond to the modulated carrier voltage nonlinearly. The third RFFE interface 52 is configurable as a carrier digital interface wherein the carrier LUT is programmable to receive new direct current carrier bias values over the carrier digital interface. Similarly, the third RFFE interface 52 is configurable as a peaking digital interface wherein the carrier look-up table is programmable to receive new direct current carrier bias values over the peaking digital interface.

Figure 8A:
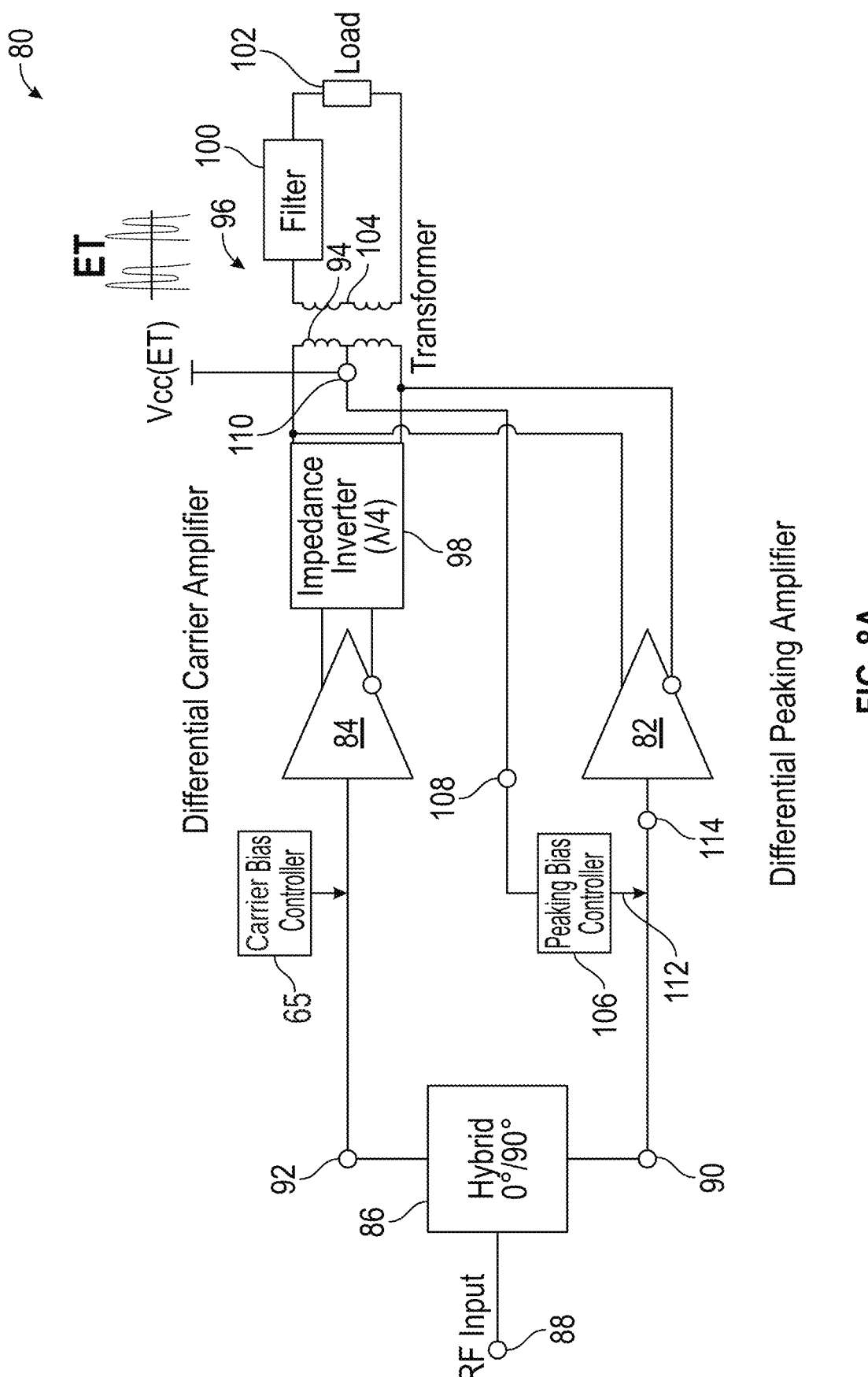
FIGS. 8A and 8B are diagrams showing the circuit topology of a barely Doherty ET differential amplifier using the modulated ET Vcc for peaking amplifier bias control.

FIG. 8A is a schematic of an exemplary embodiment of a differential barely ET Doherty amplifier 80 using the modulated ET Vcc for bias modulation. The differential barely ET Doherty power amplifier 80, which is of the load-line modulation type, includes a differential peaking amplifier 82 and a differential carrier amplifier 84. A 0°/90° hybrid coupler 86 has an RF input 88, first coupler input 90, and a second coupler output 92. The differential peaking amplifier 82 is coupled between the first coupler output 30 and a primary 94 of an RF transformer 96. The differential carrier amplifier 84 is coupled between the second coupler output 92 and a differential impedance inverter 98, which is coupled between the differential carrier amplifier 84 and the primary 94. A filter 100 and a load 102 are coupled across a secondary 104 of the RF transformer 96. A differential peaking bias controller 106 has a differential peaking bias control input 108 coupled to a primary tap 110 and a differential peaking bias control output 112 coupled to a differential peaking bias input 114. In operation, the differential peaking bias controller 106 generates a modulated peaking bias signal that controls bias of the differential peaking amplifier 82 in response to a modulated peaking supply voltage at the primary tap 110. In operation, the differential peaking bias controller 106 generates a modulated peaking bias signal that controls bias of the differential peaking amplifier 82 in response to a modulated peaking supply voltage Vcc (ET) at the primary tap 110.

Figure 8B:
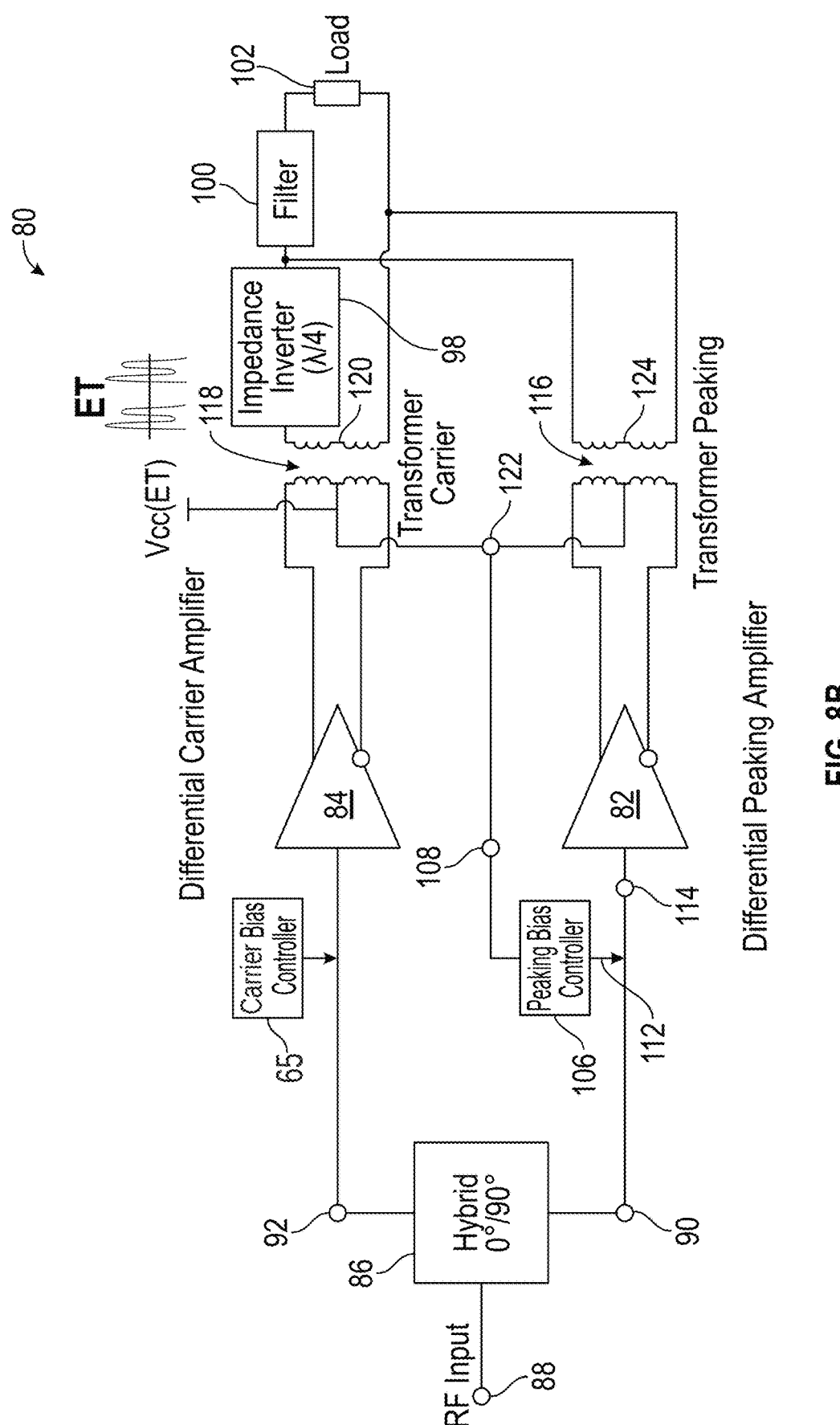

FIG. 8B is a schematic of another version of the exemplary embodiment of the differential barely ET Doherty amplifier 80 using the modulated ET Vcc for bias modulation of the differential peaking amplifier 82. In this case, the differential peaking amplifier 82 is coupled to a peaking transformer 116 and the differential carrier amplifier 84 is coupled to a carrier transformer 118. Also, in this case, the differential impedance inverter 98 is coupled between a secondary 120 of the carrier transformer 118 and the filter 100. Furthermore, the differential peaking bias control input 108 is coupled to a common primary tap 122. A secondary 124 of the peaking transformer 116 is coupled across the filter 100 and the load 102. In operation, the differential peaking bias controller 106 generates a modulated peaking bias signal that controls bias of the differential peaking amplifier 82 in response to a modulated peaking supply voltage Vcc (ET) at the common primary tap 122.

Figure 9:
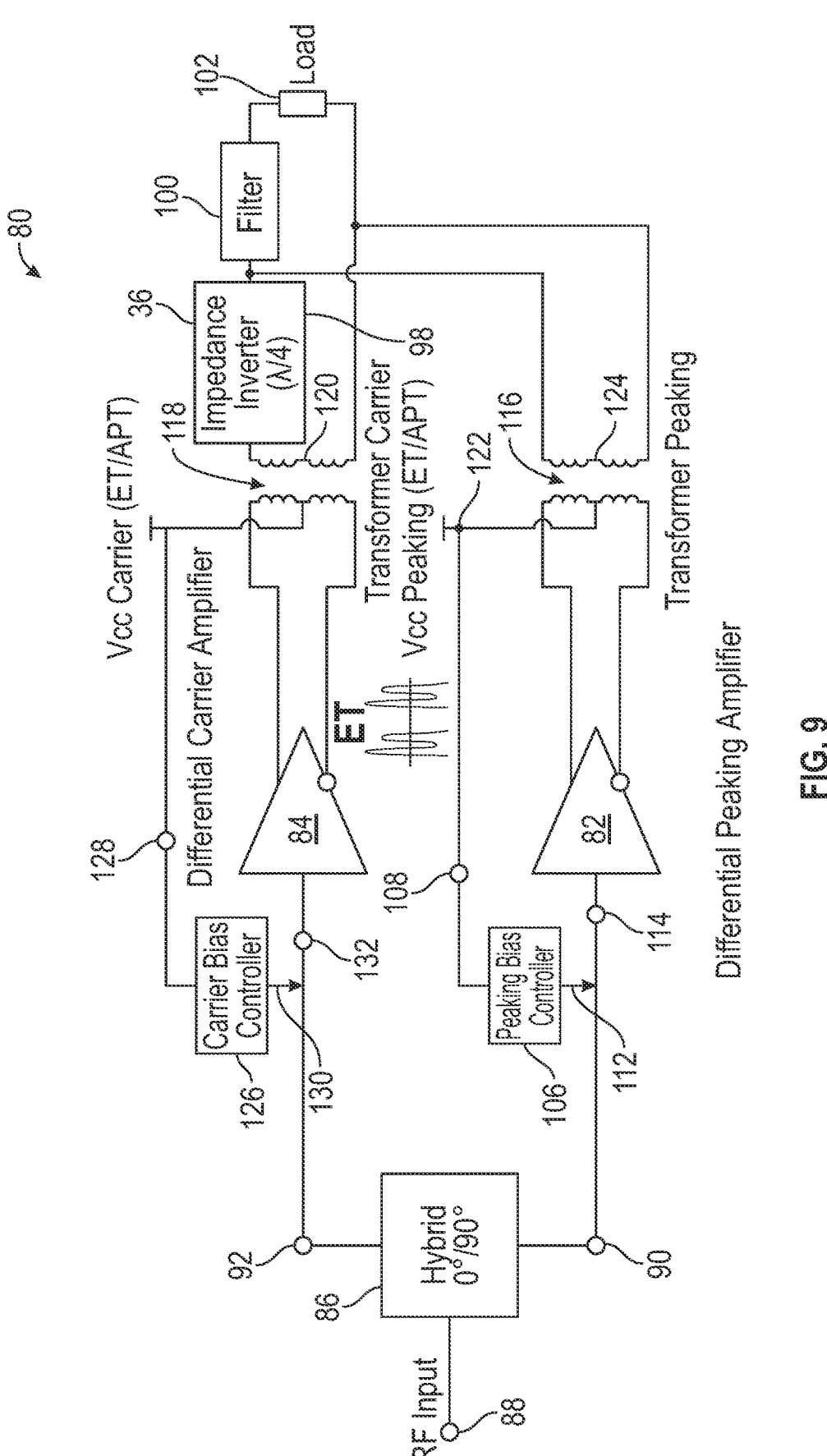
FIG. 9 is a diagram showing a circuit topology of a barely Doherty ET differential amplifier using two independent ET Vccs, each applied also to its respective bias control.

FIG. 9 is a schematic showing an embodiment showing separate ET Vcc, one for the differential carrier amplifier 84 and one for the differential peaking amplifier 82, with bias control modulation using their respective ET Vcc modulations. In this case, a carrier bias controller 126 has a differential carrier bias control input 128 that is coupled to a carrier supply node labeled Vcc Carrier (ET/APT) and a differential carrier bias control output 130 coupled to a carrier bias input 132. Also, the differential peaking bias control input 108 is coupled to a peaking supply node labeled Vcc Peaking (ET/APT).

In operation, the differential peaking bias controller 106 generates a modulated peaking bias signal that controls bias of the differential peaking amplifier 82 in response to the modulated peaking supply voltage Vcc (ET/APT) at the common primary tap 122. Moreover, the differential carrier bias controller 126 generates a modulated carrier bias signal that controls bias of the differential carrier amplifier 84 in response to the modulated carrier supply voltage Vcc (ET).

Figure 10:
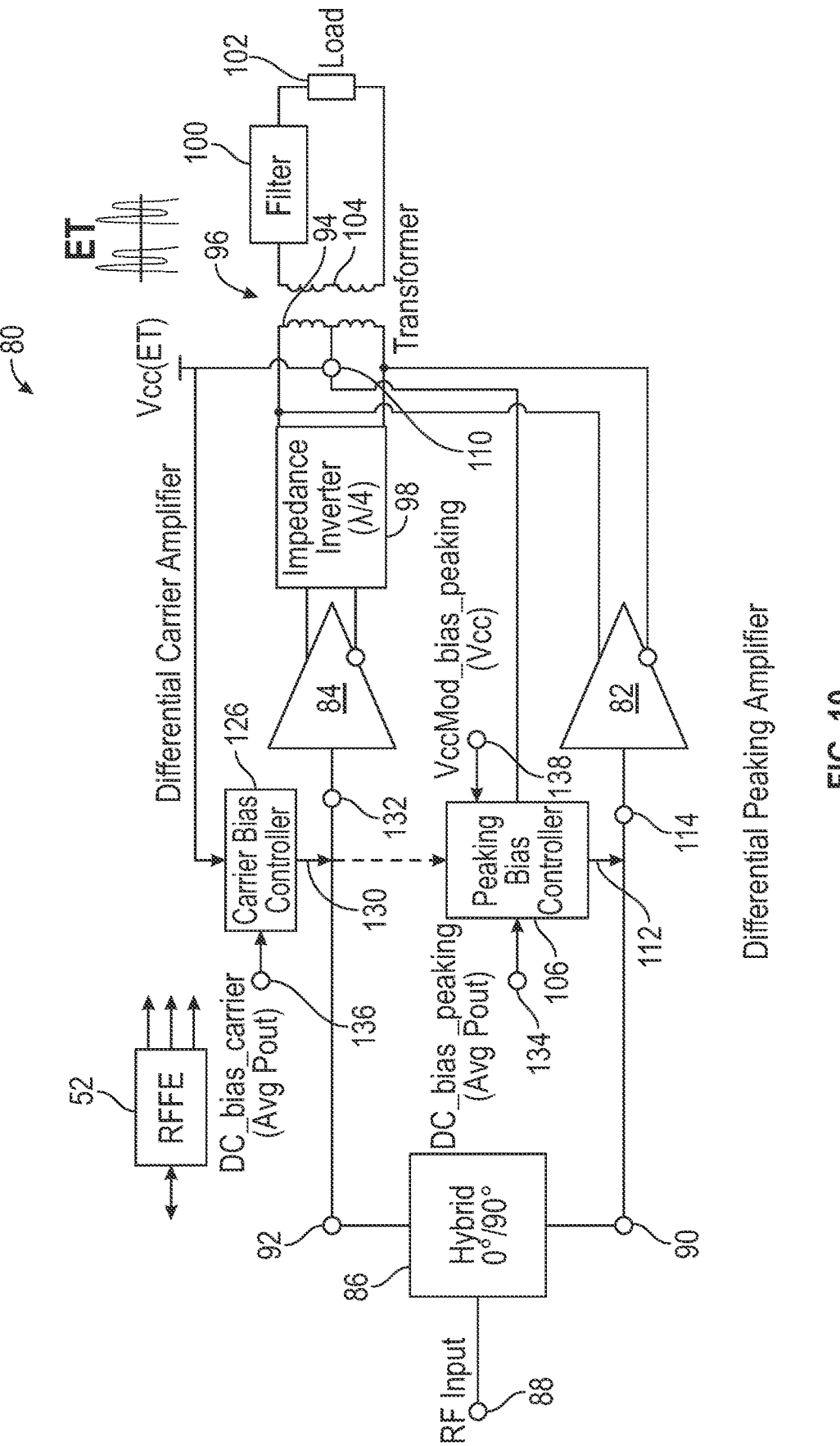
FIG. 10 is a diagram showing a main embodiment showing direct current (DC) bias control, as a function of Pout, and modulated bias control using the modulated ET Vcc.

FIG. 10 is schematic of another version of the exemplary embodiment of the differential barely ET Doherty amplifier 80 in which the differential peaking bias controller 106 includes a peaking DC bias input 134. The differential peaking bias controller 106 is further configured to add DC bias control to the differential peaking amplifier 82 as a function of average output power (Avg Pout). The carrier bias controller 126 includes a carrier DC bias input 136. The carrier bias controller 126 is further configured to control the bias of the differential carrier amplifier 84 as a function of average output power (Avg Pout).

Figure 11:
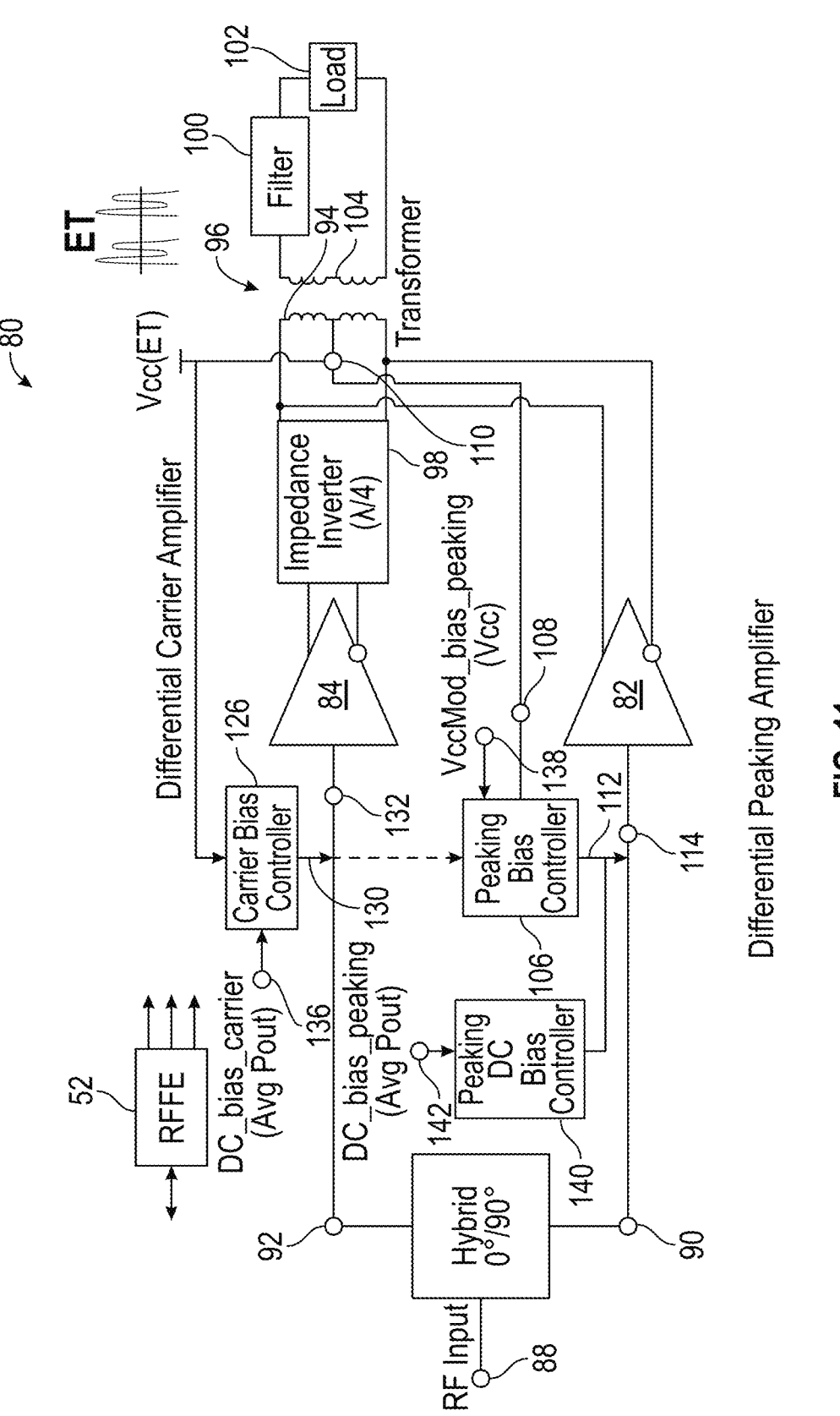
FIG. 11 is a diagram showing a main embodiment showing the two bias sums for the peaking amplifier.

FIG. 11 is schematic of a version of the exemplary embodiment of the differential barely ET Doherty amplifier 80 in which the differential peaking bias controller 106 is not configured to add DC bias control to the differential peaking amplifier 82. Instead, a separate peaking DC bias controller 140 having a DC bias input 142 is further configured to control the bias of the differential peaking amplifier 82 as a function of average output power (Avg Pout). The peaking amplifier bias control is thus the sum of a DC bias control programmed via the third RFFE interface 52 that is function of Pout and a modulated bias using the modulated ET Vcc, which slope can be also programmable via the third RFFE interface 52, as shown in FIG. 11.

Figure 12:
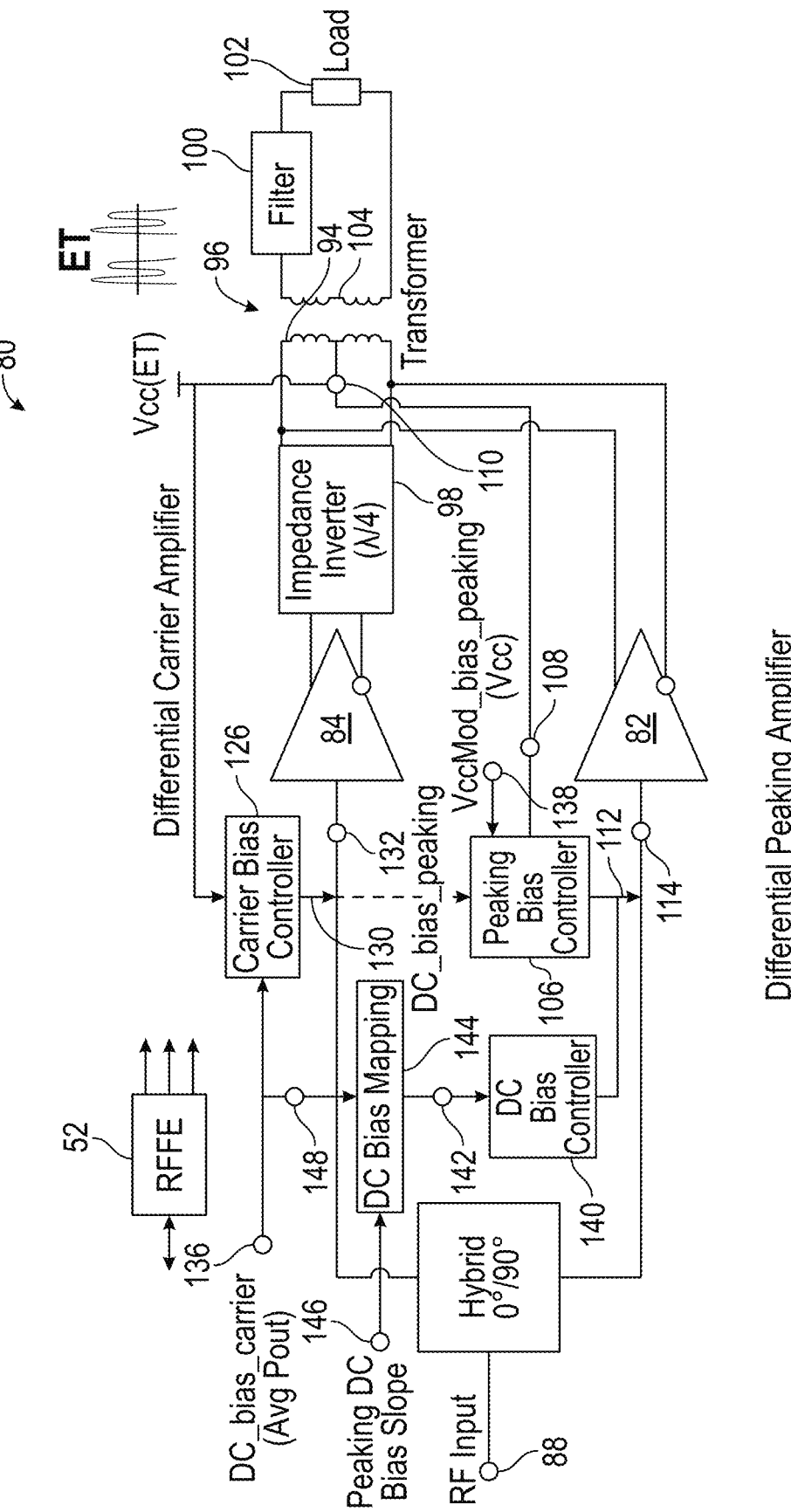
FIG. 12 is a diagram showing a single DC bias programming and internal mapping to program the DC bias of the peaking amplifier from the carrier amplifier value.

One also may consider the embodiment in FIG. 12, in which the third RFFE interface 52 configured as the carrier digital interface only programs one DC bias value that is a function of Pout and that is used to adjust the bias for the carrier amplifier, similar to any other type of power amplifier. Then internally, an analog or digital map to the corresponding DC bias value is made for the peaking amplifier using an analog or digital LUT stored within DC bias mapping 144, which can be adjustable via the third RFFE interface 52 configured as the peaking digital interface if needed, and thus only requiring the programming versus total power control changes of one DC bias value and thus maintaining compatibility with all other types of power amplifiers, as shown in FIG. 12. Changes in DC bias corresponding to DC bias values selected from the DC bias mapping 144 are conveyed through the DC bias input 142. Selections of DC bias values are a function of peaking DC bias slope transmitted through a bias slope terminal input 146. Selections of DC bias values may also be made through an average output power input terminal 148.

Figure 13:
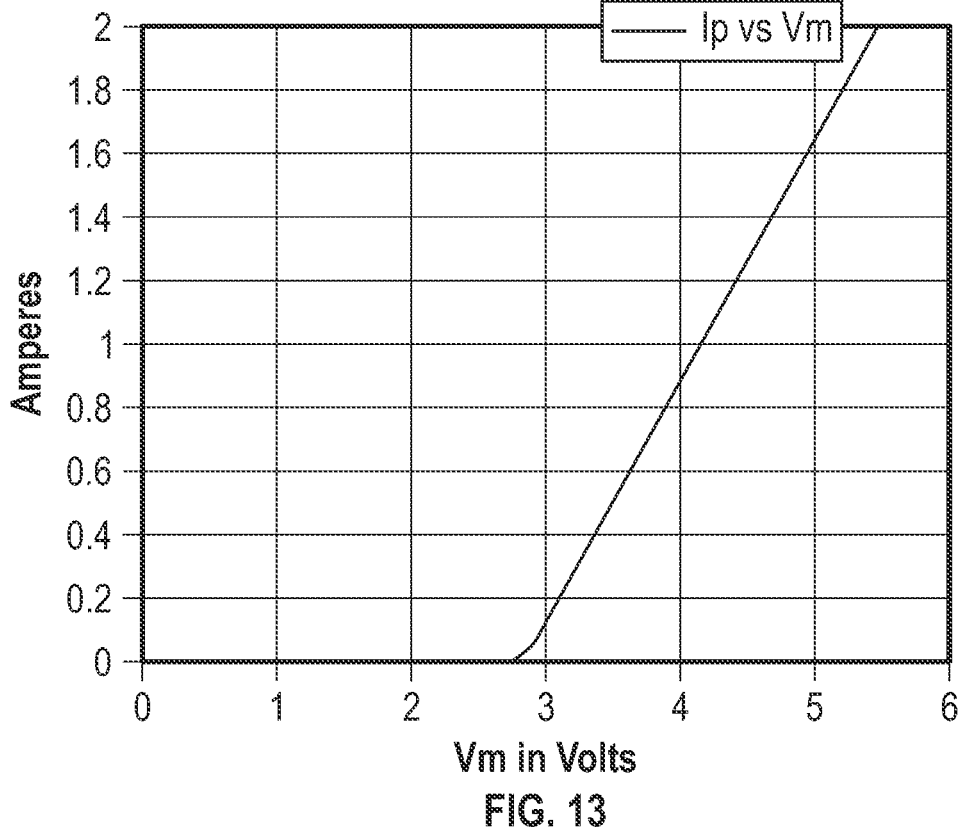
FIG. 13 is a graph showing an example of peaking amplifier bias control represented by Ip/b relative to the modulated ET Vcc.
Figures 14, 15:
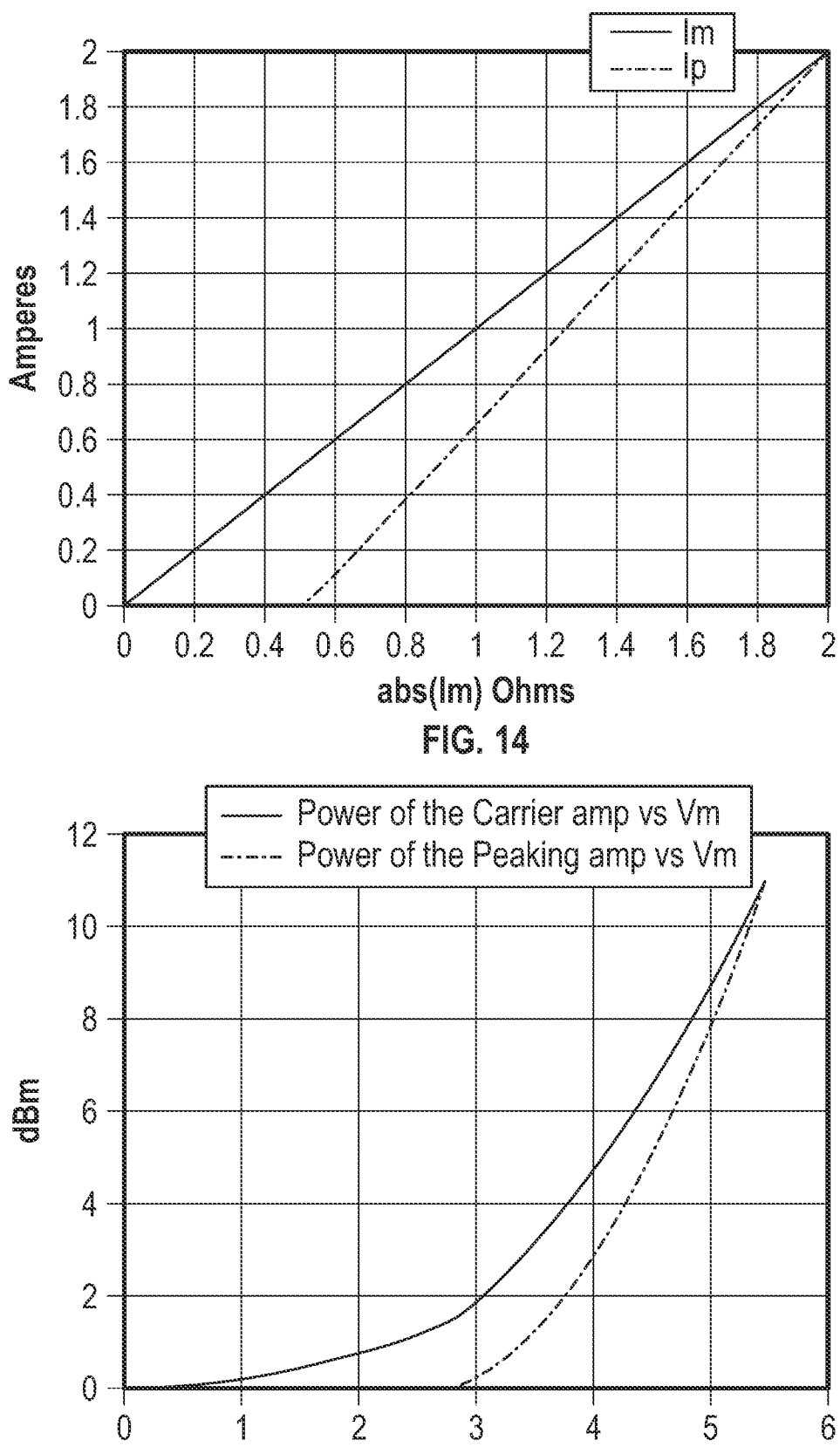
FIGS. 14 to 21 are graphs showing various ET barely Doherty signals.
Figure 16:
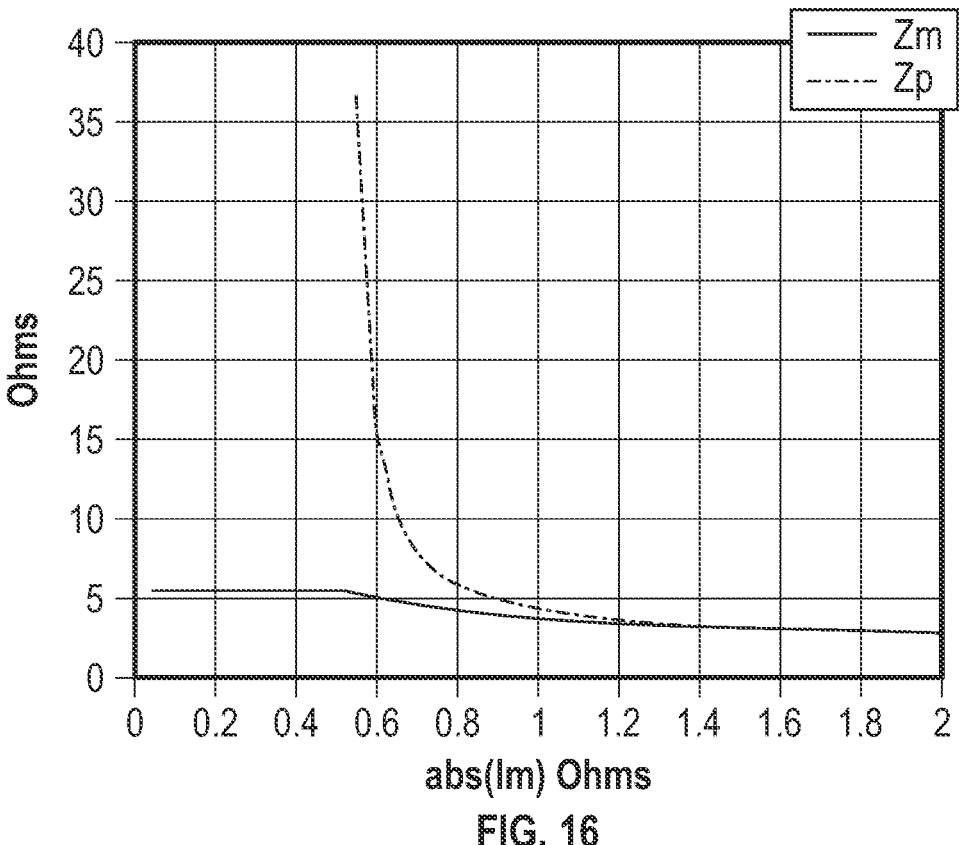
Figure 17:
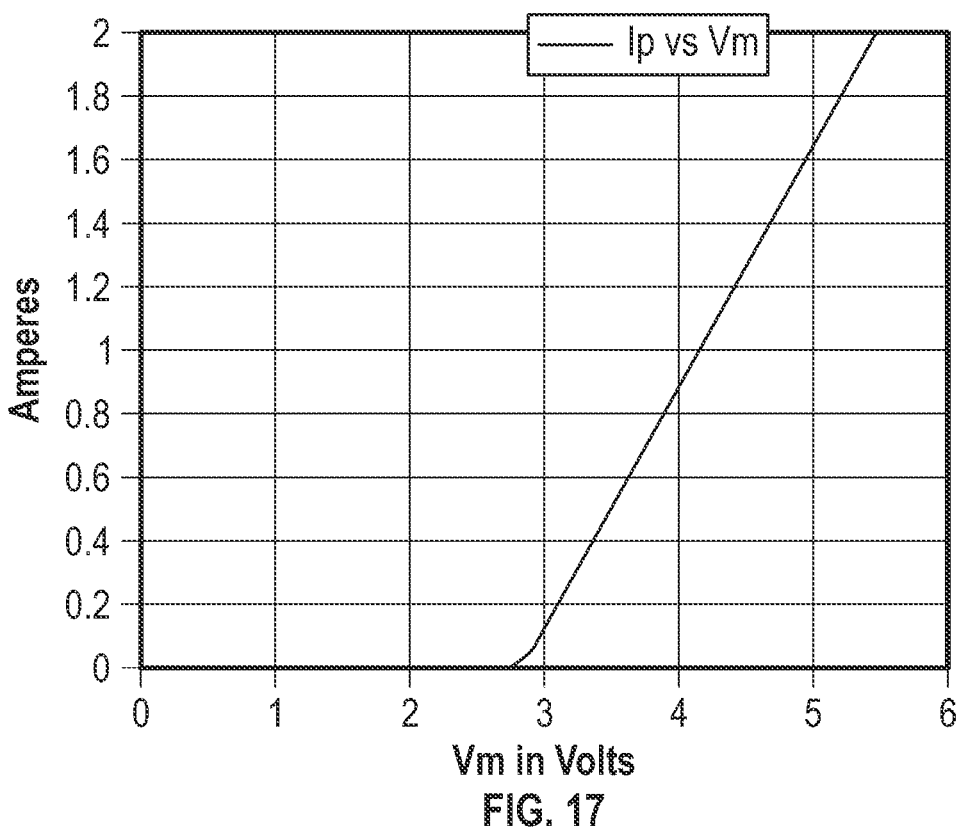
Figures 18, 19:
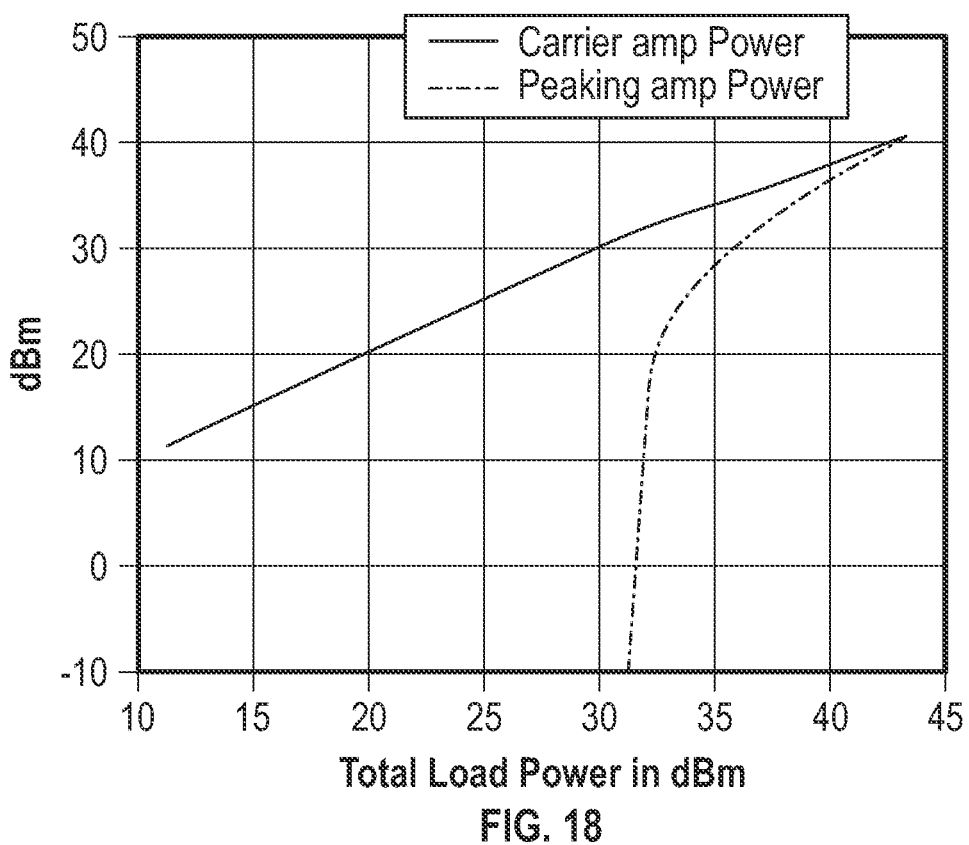
Figures 20, 21:
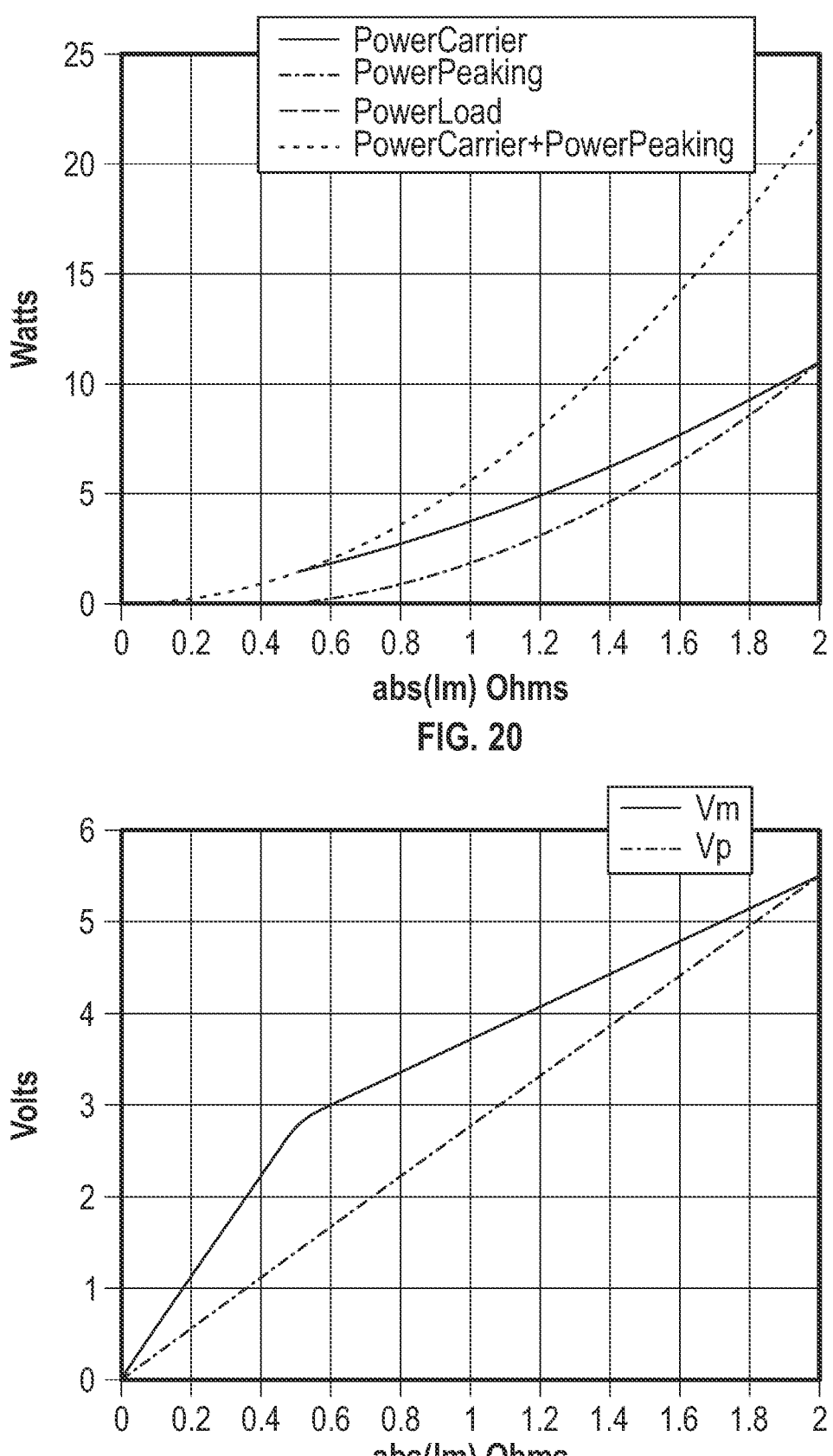

FIG. 13 shows an example of peaking amplifier bias control represented by Ip/b relative to the modulated ET Vcc, which is labeled Vm in FIG. 13. FIGS. 14 to 21 show various ET barely Doherty signals.

An advantage of the disclosed embodiments is that the peaking amplifier bias control is based on two components:
  one DC bias control that is adjustable via the radio frequency front-end (RFFE) to adjust the DC bias versus average output power change, and
  a modulated bias control that uses the modulated ET Vcc, which relation relative to ET Vcc can be made programmable via RFFE programming. Note that the embodiments are configured to handle wide bandwidth modulation to avoid creating memory effects.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier system comprising:
  a carrier amplifier having a carrier bias input and a carrier supply node;
  a peaking amplifier having a peaking bias input and a peaking supply node;
  an envelope tracking power supply having a modulated voltage supply output coupled to the peaking supply node;
  a peaking bias controller having a peaking bias control input coupled to the peaking supply node and a peaking bias control output coupled to the peaking bias input, wherein the peaking bias controller generates in response to a modulated peaking supply voltage generated by the envelope tracking power supply at the peaking supply node a modulated peaking bias signal that controls bias of the peaking amplifier;
  a peaking direct current (DC) bias controller coupled to the peaking bias input, wherein the peaking DC bias controller is configured to adjust DC bias of the peaking amplifier as a function of average output power of the peaking amplifier; and
  a carrier bias controller coupled between the modulated voltage supply output and the carrier bias input, wherein the carrier bias controller is configured to adjust DC bias of the carrier amplifier as a function of average output power of the carrier amplifier.

2. The power amplifier system of claim 1 wherein the peaking bias controller comprises a peaking look-up table having direct current peaking bias values that correspond with instantaneous levels of the modulated peaking supply voltage.

3. The power amplifier system of claim 2 wherein the direct current peaking bias values correspond to the modulated peaking voltage nonlinearly.

4. The power amplifier system of claim 2 further comprising a peaking digital interface coupled to the peaking look-up table, wherein the peaking look-up table is programmable to receive new direct current peaking bias values over the peaking digital interface.

5. The power amplifier system of claim 4 wherein the peaking digital interface is derived from a radio frequency front-end (RFFE) control interface.

6. The power amplifier system of claim 1 further comprising a carrier bias controller having a carrier bias control input coupled to the carrier supply node and a carrier bias control output coupled to the carrier bias input, wherein the carrier bias controller generates in response to a modulated carrier supply voltage generated by the envelope tracking power supply at the carrier supply node a modulated carrier bias signal that controls bias of the carrier amplifier.

7. The power amplifier system of claim 6 wherein the carrier bias controller comprises a carrier look-up table having direct current carrier bias values that correspond with instantaneous levels of the modulated carrier supply voltage.

8. The power amplifier system of claim 7 wherein the direct current carrier bias values correspond to the modulated carrier voltage nonlinearly.

9. The power amplifier system of claim 7 further comprising a carrier digital interface derived from the carrier look-up table, wherein the carrier look-up table is programmable to receive new direct current carrier bias values over the carrier digital interface.

10. The power amplifier system of claim 9 wherein the carrier digital interface is derived from a RFFE control interface.

11. The power amplifier system of claim 6 wherein the modulated peaking bias signal that controls bias of the peaking amplifier has a modulation bandwidth that is between 400 MHz and 500 MHz.

12. The power amplifier system of claim 6 wherein the carrier bias controller comprises:

a carrier look-up table configured such that the look-up table maps levels of the modulated carrier supply voltage to direct-current (DC) bias values applied to the carrier amplifier.

13. The power amplifier system of claim 1 wherein the peaking amplifier and the carrier amplifier are configured as differential amplifiers.

14. The power amplifier system of claim 1 wherein the envelope tracking power supply is configured to supply the carrier amplifier with an average power tracking (APT) modulated supply voltage.

15. The power amplifier system of claim 1 wherein the envelope tracking power supply is configured to supply the peaking amplifier with an APT modulated supply voltage.

16. The power amplifier system of claim 1 wherein the envelope tracking power supply is configured to supply the carrier amplifier with instantaneous envelope tracking modulated voltage.

17. The power amplifier system of claim 1 wherein the envelope tracking power supply is configured to supply the peaking amplifier with instantaneous envelope tracking modulated voltage.

18. The power amplifier system of claim 1 further comprising a direct current (DC) bias mapping look-up table from which the peaking DC bias is derived, wherein the DC bias mapping look-up table is configured to adjust slope of the peaking bias control.

19. The power amplifier system of claim 18 wherein the DC bias mapping look-up table is programmable over a RFFE control interface.

20. The power amplifier system of claim 1 wherein the carrier bias controller and the peaking DC bias controller are configured to receive average power output values that correspond to power output of the carrier amplifier and the peaking amplifier, wherein the carrier bias controller and the peaking DC bias controller are configured to control the carrier DC bias and the peaking DC bias in response to the average power output values.

21. The power amplifier system of claim 20 wherein the average power output values are transmitted to the carrier bias controller and the peaking DC bias controller over a RFFE control interface.

* * * * *